United States Patent

Bennett et al.

(10) Patent No.: US 10,630,051 B2
(45) Date of Patent: Apr. 21, 2020

(54) PHOTON SOURCE (71) Applicant: Kabushiki Kaisha Toshiba, Minato-ku (JP)

(72) Inventors: Anthony John Bennett, Cambridge (GB); Andrew James Shields, Cambridge (GB)

(73) Assignee: Kabushiki Kaisha Toshiba, Minato-ku (JP)

( * ) Notice: Subject to any disclaimer, the term of this patent is extended or adjusted under 35 U.S.C. 154(b) by 533 days.

(21) Appl. No.: 14/468,469

(22) Filed: Aug. 26, 2014

(65) Prior Publication Data

US 2015/0333840 A1    Nov. 19, 2015

(30) Foreign Application Priority Data

May 15, 2014    (GB) .................................. 1408674.8

(51) Int. Cl.
*H01S 5/04*    (2006.01)
*H04B 10/70*   (2013.01)
(Continued)

(52) U.S. Cl.
CPC ............ *H01S 5/041* (2013.01); *H01S 5/0614* (2013.01); *H04B 10/70* (2013.01); *H04J 14/06* (2013.01);
(Continued)

(58) Field of Classification Search
CPC ... H01L 33/0012; H01S 5/041; H01S 5/0614; H01S 5/4025; H04B 10/70; H04J 14/06; G06N 99/002
(Continued)

(56) References Cited

U.S. PATENT DOCUMENTS 6,956,330 B2 * 10/2005 Santori .................. B82Y 10/00
                                                    315/111.81
6,988,058 B1 *  1/2006 Sherwin ................ B82Y 10/00
                                                    250/207
(Continued)

FOREIGN PATENT DOCUMENTS

EP    0 892 474 A1    1/1999
GB    2460666 A      12/2009
(Continued)

OTHER PUBLICATIONS

Office Action dated May 31, 2016 in Japanese Patent Application No. 2015-004459 (submitting English translation only).
(Continued)

*Primary Examiner* — Dzung Tran
(74) *Attorney, Agent, or Firm* — Oblon, McClelland, Maier & Neustadt, L.L.P.

(57) ABSTRACT

A photon source comprising a quantum structure capable of defining one or more quantum levels such that a photon may be emitted from the quantum structure due to a transition between at least two quantum levels,
  a control signal configured to vary the transition energy, the transition energy being the energy separation between the at least two quantum levels; and
  a laser input beam configured to irradiate the quantum structure,
  the control signal being configured to bring the transition energy into resonance with the laser input beam and out of resonance with the laser input beam, such that the transition energy is resonant with the energy of the laser input beam for a time less than the time to output two photons from the transition.

22 Claims, 8 Drawing Sheets (51) Int. Cl.
*H04J 14/06* (2006.01)
*H01S 5/06* (2006.01)
*H01S 5/40* (2006.01)
*H01S 5/34* (2006.01)
*G06N 10/00* (2019.01)

(52) U.S. Cl.
CPC ............ *G06N 10/00* (2019.01); *H01S 5/3412* (2013.01); *H01S 5/4025* (2013.01)

(58) Field of Classification Search
USPC ............ 257/14; 315/291; 365/147; 359/108; 977/774
See application file for complete search history.

(56) References Cited

U.S. PATENT DOCUMENTS

| | | | | |
|---|---|---|---|---|
| 2002/0196827 | A1* | 12/2002 | Shields | B82Y 20/00 372/45.01 |
| 2003/0127608 | A1* | 7/2003 | Shields | B82Y 10/00 250/493.1 |
| 2004/0197070 | A1* | 10/2004 | Takemoto | B82Y 20/00 385/147 |
| 2010/0119193 | A1* | 5/2010 | Englund | B82Y 20/00 385/16 |
| 2011/0108743 | A1* | 5/2011 | Bennett | B82Y 20/00 250/493.1 |
| 2011/0242632 | A1 | 10/2011 | Bennett et al. | |
| 2012/0120972 | A1 | 5/2012 | Belenky et al. | |
| 2012/0326624 | A1 | 12/2012 | Bennett et al. | |

FOREIGN PATENT DOCUMENTS

| | | |
|---|---|---|
| GB | 2476926 A | 7/2011 |
| JP | 2004-253657 A | 9/2004 |
| JP | 2011-209725 A | 10/2011 |
| JP | 2013-510419 A | 3/2013 |
| JP | 2013-510420 A | 3/2013 |
| WO | WO 2011/055119 A2 | 5/2011 |

OTHER PUBLICATIONS

M. A. Pooley and A. J. Bennett, et al., "Energy-Tunable Quantum Dot with Minimal Fine Structure Created by Using Simultaneous Electric and Magnetic Fields", Physical Review Applied, vol. 1, 2014, pp. 024002-1-024002-5.

A. J. Bennett, et al., "Indistinguishable photons from a diode" Applied Physics Letters, vol. 92, 2008, pp. 193503-1-193503-3.

A. Muller, et al., "Resonance Fluorescence from a Coherently Driven Semiconductor Quantum Dot in a Cavity", Physical Review Letters, vol. 99, 2007, pp. 187402-1-187402-4.

A. Nick Vamivakas, et al., "Spin-resolved quantum-dot resonance fluorescence", Nature Physics, Letters, Jan. 25, 2009, pp. 1-5.

Yu-Ming He, et al., "On-demand semiconductor single-photon source with near-unity indistinguishability", Nature Nanotechnology, Articles, Feb. 3, 2013, pp. 1-5.

H. S. Nguyen, et al., "Optically Gated Resonant Emission of Single Quantum Dots", Physical Review Letters, vol. 108, 2012, pp. 057401-1-057401-5.

Combined Search and Examination Report dated Oct. 31, 2014 in United Kingdom Patent Application No. GB 1408674.8.

* cited by examiner

PHOTON SOURCE

CROSS-REFERENCE TO RELATED APPLICATION

This application is based upon and claims the benefit of priority from prior United Kingdom Application number 1408674.8 filed on May 15, 2014, the entire contents of which are incorporated herein by reference.

FIELD

Embodiments of the present invention as described herein are generally concerned with the field of photon sources.

BACKGROUND

In the field of quantum information such as quantum communication and quantum cryptography, there is a need to reliably produce single photons. One photon source which has been previously suggested for producing single photons is based on quantum dots. In a quantum dot, an exciton is formed when there is a bound state between a small number of electrons in the conduction band and holes in the valence band, radiative decay occurring when one hole and one electron recombine resulting in the emission of a photon. Due to the Pauli Exclusion Principle each transition cannot give rise to the emission of two photons at the same time. These photons can be used as "flying quantum bits" to carry quantum information in an application, where the information is encoded on the polarisation of the photon, its energy or the spatial mode it travels in.

A desirable property of such photons is that they are coherent, that is with a narrow spectrum which is invariant in time, all photons being identical. The "natural linewidth" of the transition, $\hbar/\tau_r$, is determined by its radiative lifetime ($\tau_r$), if this is the case the transition is said to be homogeneously broadened. This property allows the quantum "bits" of information to display two-photon interference, which is essential for exchanging information between them, and thus building logic gates which can manipulate the quantum information. In the field of quantum cryptography, two photon interference is an essential component of quantum repeater schemes needed to increase the distance over which information may be sent. In addition, coherent photons are preferred for some quantum-optical metrology applications as their narrow spectrum increases the resolution of the system.

Emission from solid state light sources is often inhomogeneously broadened, with a linewidth greater than the "natural linewidth" due to dephasing and spectral jitter. The visibility of two photon interference for a pulsed inhomogeneously broadened light source is approximated to the ratio $\tau_c/2\tau_r$, where $\tau_c$ is the "coherence time" of the spectrum (which is equal to $h/\pi*dE$ where $dE$ is the width of transition) and $\tau_r$ is the radiative lifetime. Fluctuations in the central energy of the transitions between photon emission events will further reduce the visibility. With non-resonant excitation it is challenging to obtain a high visibility of interference in solid state systems, due to the excitation of excess carriers in the structure. However, direct excitation of the transition at the same energy as the emitted photon can eliminate this problem and lead to photons being emitted with very narrow linewidth.

BRIEF DESCRIPTION OF THE DRAWINGS

FIG. 10 is experimental data showing the time-varying emission from a pair of neutral exciton eigenstates as they are periodically swept across a CW high coherence laser. At the optimum DC offset voltage (shown at the horizontal dotted line) photons are generated within a short time window when the transition and laser are resonant.

DETAILED DESCRIPTION OF THE DRAWINGS

According to an embodiment, a photon source is provided as recited in claim 1.

The above source resonantly excites the quantum structure that may be a quantum dot with a coherent laser at the same energy as the transition of interest. This technique is known as "Resonance Fluorescence". This ensures that no other states in the vicinity of the dot or other quantum structure are populated.

For the rest of the discussion, the quantum structure will be envisaged as a quantum dot. However, the quantum structure is not limited to a quantum dot and may comprise an optically active defect centre in a solid state device or other structure capable of defining quantum levels.

In the above embodiment, the control signal is configured to bring the transition energy into resonance with the laser input beam and out of resonance with the laser input beam, such that the transition energy is resonant with the energy of the laser input beam for a time less than the time to output two photons from the transition.

In a further embodiment, the control signal is configured such that the extrema of the control signal brings the transition energy into resonance with the energy of the laser input beam. The extrema may be the maxima or minima of the control signal. This allows just one photon to be emitted per cycle of the control signal. The apparatus that provides the control signal may be able to increase the transition energy beyond that required for resonance. However, in this embodiment, the control signal is configured/restricted such that at its extrema, the transition energy is resonant with the laser input beam.

An advantage of the above excitation method is that it produces photons with a spectral width well below that possible with non-resonant excitation (which typically is limited to >4 micro-eV in InGaAs/GaAs quantum dots). In an embodiment, to achieve an increased probability of creating a photon in this way a higher intensity of input laser is used, that excites the transition to the upper level of the at least two quantum levels, from where radiative decay may occur.

Alternatively, in the limit of very low excitation power the linewidth is limited only by the spectrum of the exciting laser (which can have nano-eV width). In this case the laser is coherently scattered from the transition without exciting it to the upper level. Lasers with nano-eV linewidths are often running in a continuous-wave mode meaning the photons generated by the quantum dot are also emitted at poorly defined times, even if they are anti-bunched. For some applications it is more desirable to have a pulsed source of highly coherent photons.

In an embodiment, a "high" and "low" powers can be thought of in terms of the power at which the laser is strong enough to drive the transition from the lower to upper state with a greater than 50% probability in a single cycle. Powers equal or greater than this level are defined as "high" as most of the pulses will excite the dot and result in a photon emission by radiative recombination. The linewidth of the transition will be and will result in a linewidth of a few micro-eV. This is often referred to as the incoherent excitation case.

Powers less than this level are defined as "low" as most of the pulses will not excite the dot. Some excitation will occur of the transition and be again of a linewidth determined by the transition, a few micro eV. In addition, photons from the laser may scatter coherently from the transition and carry the spectrum of the laser i.e. be very narrow, sub-micro eV. The optical spectrum of the light will then a mix of these two cases but in the low power regime the spectrum is dominated by a coherent part that carries the linewidth of the laser.

In an embodiment, the linewidth of the laser input beam is less than the linewidth of the said transition and the laser input beam is provided by a CW laser.

In the above source, the source emits photons at the same energy as the laser input beam. To isolate the photons emitted due to exciton decay, in an embodiment, the photon source further comprises collection optics for collecting the photon emitted from the structure, wherein the source is configured such that the input laser beam is prevented from entering the collection optics.

In an embodiment, the source is configured to prevent the input laser beam from entering the collection optics by comprising polarising components configured to polarise the input laser beam and block the polarised input laser beam from entering the collection optics. This type of arrangement can be used where the input laser beam enters the device through the same surface from which the photon is emitted.

However, other arrangements are possible. The emission direction of the photons is controlled by the eigenstates of the transitions that are resonantly excited. For example, in an InGaAs system the Eigenstates are orthogonal and parallel to the [110] direction. In an embodiment, there is some component of both the polarisation direction of the input laser beam and the output signal that is parallel to the Eigenstate. In this configuration, the coupling of the input beam to the output mode is minimised. However, the coupling of the input beam to the quantum state, and then onwards from the quantum state to the output path is maximised. This can be achieved in a crossed polarisation input/output scheme where the eigenstates of the transitions are coupling to both input and output modes. Thus, considering the quantum structure provided within a device, it is possible to configure the source such that the input laser beam enters the device via a first surface of the device and the photon is emitted via a second surface that is not parallel to the first surface. As the input laser beam will exit the device in a different direction to the output signal, it is not necessary to provide a further component to block the input laser beam from entering the collection optics.

Dependent on the configuration of the source, it is possible to use a transition that has degenerate Eigenstates. Such a system can thus, emit a photon having a polarisation selected from a superposition of the states. Thus, in some embodiments the source is configured such that the transition which is resonantly excited has degenerate Eigenstates such that the input laser beam excites more than one degenerate Eigenstate. An example of such a transition is the charged exciton transition in an InAs quantum dot.

As noted above, the device may comprise a quantum dot, but may be any other structure capable of zero or quasi zero-dimensional confinement. Although the embodiments described herein are largely exemplified with reference to InGaAs/GaAs quantum dots, they is applicable to any solid-state quantum light source that can be Stark shifted by an applied voltage. Using quantum dots with different properties and in different materials (such as such as InAs/InP, GaSb/GaAs) the emission can be extended to other wavelengths (i.e. the Telecoms wavelengths of 1300 and 1550 nanometers). Alternatively, single defects in any solid-state system that can be optically isolated may be used such as Diamond (where the NV0, NV- and SiV vacancies have been well studied). Another example is isolated impurities in ZnSe/ZnMgSe nanostrcutures which are known to have a narrow emission linewidth at low temperatures, and can be readily contacted.

Also, the device may be a p-i-n diode, but other types of device are possible for example, n-i-p, n-i-n, p-i-p or ohmic-i-schottky devices. The device may also comprise barriers on either side of the quantum dot as this will allow a larger filed to be provided across the quantum dot.

The quantum dot or quantum structure may be located in an optical cavity.

In an embodiment, the control signal is an electrical control signal and is configured to control the transition via the quantum confined stark effect. However, other types of control signal are possible, for example, magnetic fields, pressure, heat or strain fields in the crystal.

In a further embodiment the photon source comprises a plurality of quantum dots and a control signal applied to each quantum dot, such that each dot can be brought into resonance with the input laser beam, the input laser beam being supplied to each quantum dot. Each quantum dot may be provided in a separate structure or the dots may be provided in the same structure and connected via waveguides or the like. The plurality of quantum dots may be arranged in series with respect to the input laser beam.

The output of the photon source may be directed into a quantum communication system or quantum information system. For example, the source may be configured to output identical photons into a quantum logic component. The quantum logic component may be configured as a CNOT gate.

As noted above the transition excited in the course may be a neutral exciton transition or a charged exciton transition.

In a further embodiment, the control signal is configured such that the time duration when the transition is in resonance with the input laser beam and the intensity of the input laser beam are selected so that the photon emission probability is maximised. The probability of exciting the transition varies sinusoidally with the product of amplitude of the input laser beam and the time duration when the transition is in resonance. In an embodiment, the laser power and control signal are chosen to maximise the probability of exciting the transition.

In a yet further embodiment, a method of operating a photon source is provided, the method comprising:
providing a quantum structure capable of defining one or more quantum levels such that a photon may be emitted from the quantum structure due to a transition between at least two quantum levels;
irradiating the quantum structure with a laser input beam; and
varying the transition energy of the quantum structure with a control signal, the control signal being configured to bring the transition energy into resonance with the laser input beam and out of resonance with the laser input beam, such that the transition energy is resonant with the energy of the laser input beam for a time less than the time to output two photons from the transition.

Figure 1A:
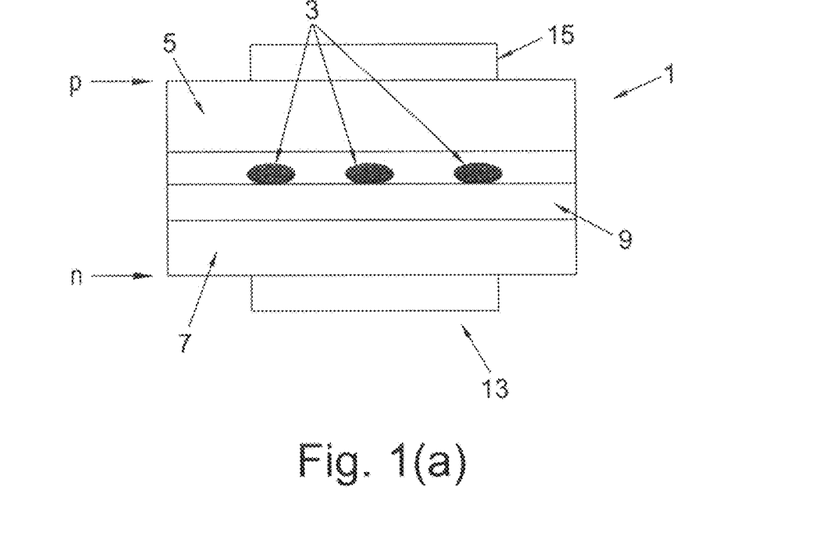
FIG. 1(a) is a schematic of a device comprising a quantum dot which may be used in a source in accordance with an embodiment and FIG. 1(b) is a schematic band structure of the device of FIG. 1(a)

FIG. 1(a) is a schematic of a diode 1, comprising a quantum dot 3. The diode is a p-i-n type structure with a p-type region 5 and an n-type region 7. An intrinsic region 9 is located between the p-type region 5 and the n-type region 7. A quantum dot 3 is located in the intrinsic region 9. Electrodes 13 and 15 are provided to the n-type and p-type regions respectively. These can be used to provide an electric field across the quantum dot.

Figure 1B:
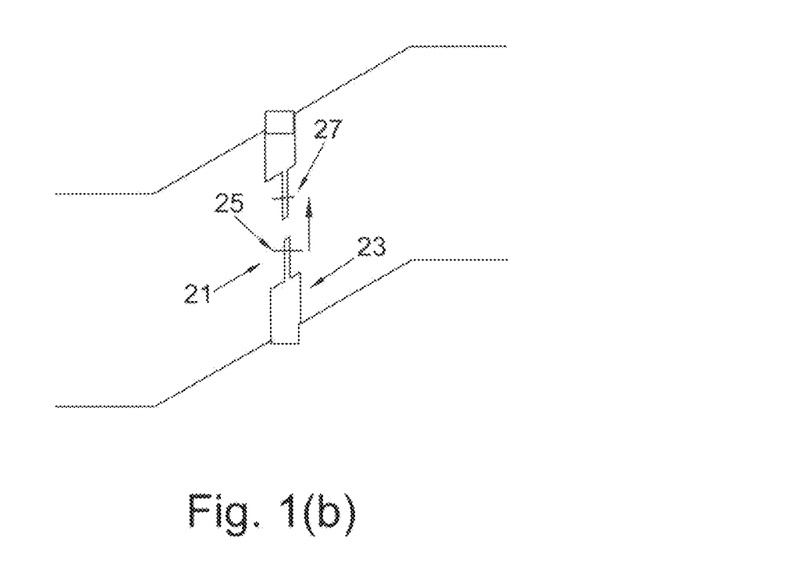

FIG. 1(b) is a schematic band diagram of the device or diode shown in FIG. 1(a). In the band diagram of FIG. 1(b), the quantum dot 21 is provided within an intrinsic region that is quantum well 23. Upon optical excitation (driving signal), an electron can be excited into the conduction band confined level 27 of the quantum dot 21 leaving behind a hole in the confined valence band level 25. The electron and hole form an exciton. Recombination of the electron and the hole result in the emission of a photon at the energy of the transition.

If the energy of the optical excitation is equal to the energy of the transition, then the excitation is resonantly excited.

In accordance with an embodiment, an electron is resonantly excited using a continuous wave (CW) beam of radiation, a input laser beam. Once the electron has been excited, the exciton in the quantum dot prevents a further exciton from being excited.

In an embodiment, the energy of the input laser beam is kept constant and the energy of the transition is varied so that it is moved into and out of resonance with the energy of the optical excitation. In an embodiment, the energy of the transition is varied using the quantum confined stark effect (QCSE) by applying an electric field across the diode 1.

In an embodiment, the Stark shift is sufficient to shift a transition by more than the natural linewidth (typically ~1 micro-eV for InAs QDs). This can be achieved by any device with electrical contacts on the surface, or with lateral contacts applying an electric field in the sample plane.

In further embodiments, other methods can be used to vary the energy of the transition, for example, using magnetic fields, pressure, heat or strain.

In a source in accordance with embodiments, by resonantly exciting the transition with CW radiation at a low laser intensity as previously discussed, the linewidth of the photon scattered is controlled by the linewidth of the driving signal. This means that a photon can be emitted with a linewidth that is narrower than the linewidth of the transition of the quantum dot 21.

The linewidth of a transition in a quantum dot is i>1 micro-electron-volt (micro eV) if radiatively limited. In experiments, non-resonantly excited dots have a linewidth closer to 4-10 micro eV. A suitable CW laser has a linewidth ~1 nano eV, and in the case that a lower power of laser is used to resonantly drive the dot the photon generated has a linewidth that is less than the linewidth of the transition and closer to that of the laser used to resonantly excite the transition.

In the diode 1 shown with reference to FIGS. 1(a) and 1(b), the quantum dot is provided in an intrinsic region within a quantum well and there are barriers on either side of the quantum well as shown in the band diagram of FIG. 1(b). The provision of one or more barriers surrounding the quantum dot allows a greater potential to be applied across the quantum dot and hence a larger variation in the transition energy can be achieved than compared with the case without barriers. However, the barriers are not essential to all embodiments.

In the embodiments of FIGS. 1(a) and 1(b), the structure is a p-i-n structure with one side of the device being p-type and the other side n-type with the dot located in the undoped region. However, similar results would be obtained with n-i-p, n-i-n, p-i-p or ohmic-i-schottky devices.

In the above embodiments, a single neutral exciton is formed under resonant optical excitation. However, charged excitons may also be formed by addition to the dot of a single charge, either an electron or a hole. This may be achieved by providing the quantum dot in proximity to an n-type or p-type doped layer within a diode, or in proximity to one or more a dopant atoms In the above embodiments, the optical excitation and the photon emitted due to decay of the exciton are of the same frequency. Therefore, the source is configured to allow the input CW radiation to be separated from the output due to the decay of the exciton in the quantum dot.

Figure 2:
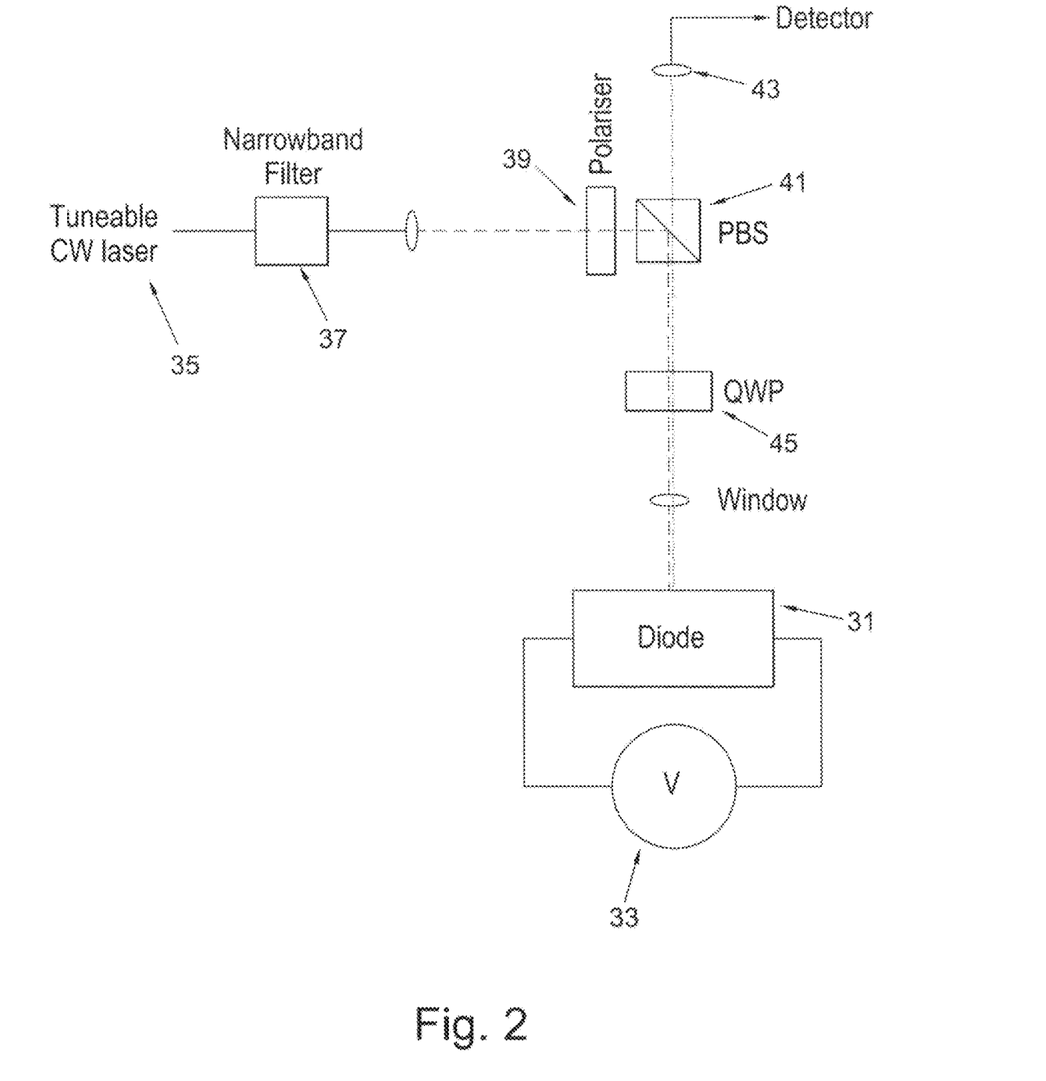
FIG. 2 is a source in accordance with an embodiment with a co-linear driving laser and photon collections optics.

FIG. 2 is a schematic diagram of a photon source in accordance with an embodiment. The source comprises a diode 31 of the type described with reference to FIGS. 1(a) and 1(b). The diode comprises a quantum dot or other quantum structure (not shown) capable of achieving zero dimensional or quasi zero dimensional quantum confinement. The diode in this embodiment comprises a voltage source, 33, that provides a bias across the electrodes (not shown) of said diode 31, to allow the band gap within the quantum dot to be varied using the quantum confined stark effect.

Said quantum dot, or more generally a quantum light source/structure, may be embedded in a microcavity. Such a cavity would be designed with an optical mode at the same energy as the transition of interest and the driving laser, and would preferentially enhance the coupling of the source transition to the optical mode in which light enters and exits the solid state device. The enhanced efficiency of coupling of light into the device would allow lower laser intensities to be used to achieve the sample excitation rate for the transition, which may be advantageous. Similarly, the enhanced efficiency of coupling of light out of the device would allow a greater proportion of the photons to be collected. In one embodiment the cavity may consist of two Bragg mirrors above and below the quantum light source.

The source further comprises a CW laser 35, which provides the input laser beam. CW laser 35 is configured to output radiation having a narrow linewidth. In this embodiment, if the CW laser is based on a semiconductor laser the output is directed through narrowband filter 37. The purpose of the Narrowband filter 37 is to remove unwanted light generated by the Tuneable CW laser 35. If the CW laser 35 is based on a semiconductor light source, the laser light will contain a tens-of-nanometer wide weak spectral component in conjunction with the narrowband emission. The purpose of this filter 37 is to eliminate the undesirable broad component.

The light is then passed through polarisation filter 39. Polarisation filter 39 serves to ensure that the input laser beam has a specific polarisation, and this helps to separate the input laser beam from the output of the diode 31.

Incident laser light (grey dashed lines) will have one linear polarisation which is reflected at the polarising beam-splitter (PBS) 41 and directed towards the diode 31. The CW light excites the diode as described with reference to FIGS. 1(*a*) and 1(*b*) and a photon is emitted from diode 31.

In the embodiment described with reference to FIG. 2, the input laser beam is incident on a first surface of the diode 31 and the photons are also emitted from the first surface. Thus, the photons exit the diode 31 along the same path as the incident CW beam.

The radiation from the diode 31 is directed towards PBS 41 which is configured to only pass light of one polarisation. Thus, only radiation emitted from the diode 31 is provided to the detector 43. Provided this polarisation optics gives sufficiently rejection of the laser (at least $10^{-6}$) then it is possible for the collected light to be predominantly anti-bunched "Fluorescent" light from the dot in the diode 31.

In the embodiment of FIG. 2, there is also a quarter waveplate (QWP) 45 above the diode 31 which may be used to measure the factor by which the system rejects the laser. When this QWP has its birefingent axis aligned with the PBS 41 the laser is maximally rejected, but by rotating the QWP 45 degrees the laser reflected by the sample will be fully transmitted to the Detector 43. In this apparatus the detector 43 may be any light detector (such as an avalanche photodiode) or an input into a quantum communication system or quantum information system.

Figure 3:
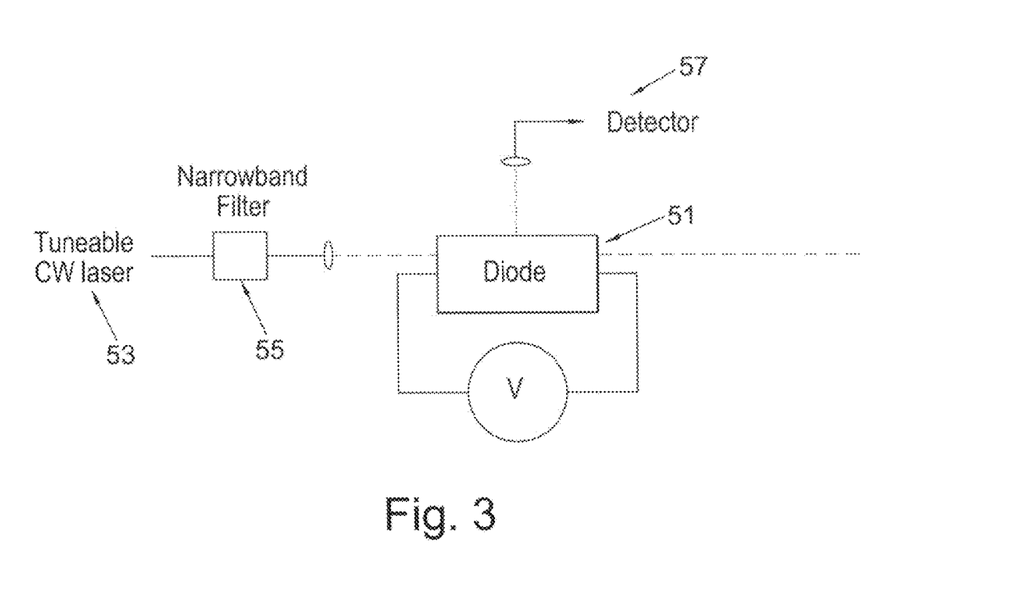
FIG. 3 is a diagram of a source in accordance with an embodiment, where a laser input beam is provided at right angles to the direction where photons emitted from the source are collected.

FIG. 3 shows an alternative method for rejecting the input laser beam by collecting light fluoresced from the diode 51 along a different direction to the input laser beam from laser 53.

The diode is configured and operates in a similar manner as described with reference to FIG. 1. However, here, the diode 51 is configured so that the CW laser 53 which provides the input laser beam illuminates the diode on a first surface and the photons are emitted from a second surface. How this is achieved will be explained with reference to FIGS. 5 and 6.

As in the arrangement of FIG. 2, the CW laser is passed through narrowband filter 55 before entering the diode 51.

By arranging the collection optics to receive radiation from the second surface of diode 51, the highly collimated laser beam from laser 53, may be prevented from entering the detector 57 and the said detector 57 may collect light from the sample containing both linear polarisations. This may offer advantages in terms of having full optical readout of a polarisation qubit stored in the spin state of charges in the dot.

In a further embodiment, greater rejection of the laser may be achieved by embedding the quantum dot within a waveguide in the diode 51, thus optimising the spatial overlap of the driving laser 53 and the optical transition within the quantum dot and minimising the scattered laser light that may reach the collection optics.

Such a waveguide may be a planar structure with Bragg mirrors above and below the guiding layer to enhance emission in the vertical direction. Such a cavity will only confine the guided light vertically: it will disperse in the lateral direction. Additional wave-guiding may be introduced by etching a "stripe" on the sample surface parallel to the propagation direction: here the lateral variation in the refractive index will guide light more effectively.

Figure 4:
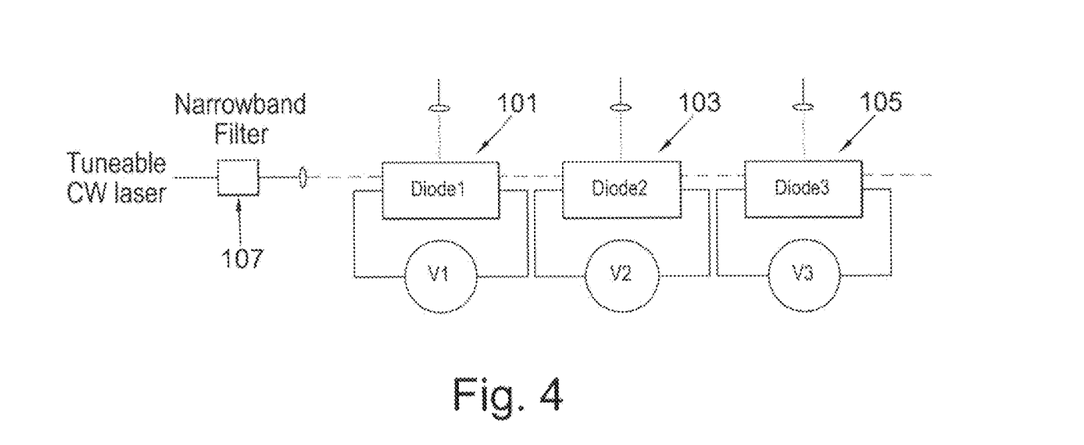
FIG. 4 is a diagram of a source with multiple quantum dots in diodes with a common laser.

FIG. 4 shows a further embodiment. Here, there are 3 diodes, 101, 103 and 105. As for the embodiment described with reference to FIG. 3, the diodes are configured such that a CW input laser beam enters from a first surface and a photon due to the decay of an exciton in the quantum dot is emitted from a second surface. In general, this embodiment may employ a multiplicity of diodes.

The diodes 101, 103 and 105 are located in series with one another such that the input laser beam from CW laser 107, passes through each of the diodes 101, 103, and 105 in turn.

Here the driving laser 107 is used to drive multiple quantum dots which may be individually addressed by separate electrodes. The dots may be in physically separated diodes, or in close proximity connected by a waveguide, but in this embodiment, each dot is individually addressable by the electrodes. By setting the voltages to the individual electrodes (V1, V2 etc) it will be possible to bring multiple transitions in separate dots into degeneracy and thus multiplex single photon sources. This is advantageous in applications where multiple photons are required, such as in quantum information processing.

Although FIG. 4 has used diodes which are configured as the diode of FIG. 3, it is also possible to use a plurality of diodes configured as explained with reference to FIG. 2 here the input laser beam is divided into a plurality of paths such a part of the input laser beam is directed to each diode.

Figure 5A:
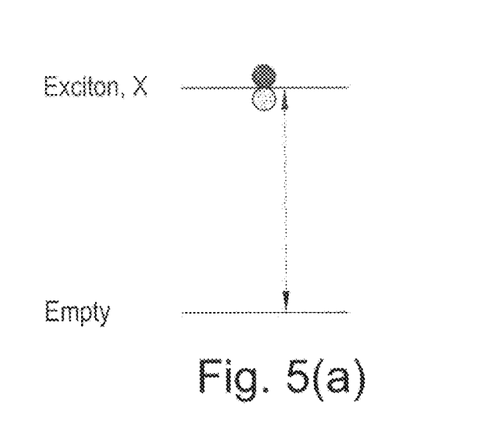
FIG. 5(a) is a schematic of a transition from a neutral exciton to an empty state in a quantum dot. The direction of the typical eigenstates in GaAs for this transition are shown on a schematic wafer in FIG. 5(b).
Figure 5B:
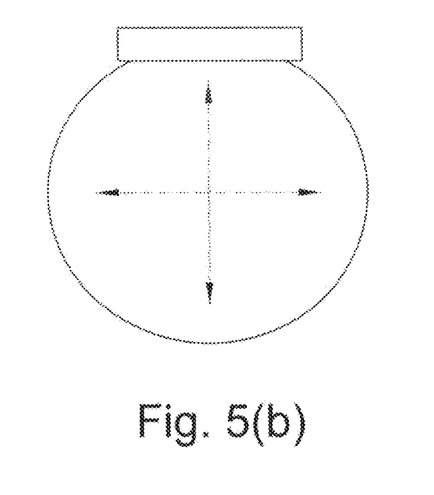

FIG. 5(*a*) shows a schematic of a neutral exciton transition. On the left hand side is shown the transition from neutral exciton to empty state in a quantum dot, which typically has eigenstates orthogonal which couple to photons with polarisation parallel to the [110] direction in GaAs. This is often marked on pre-prepared circular GaAs substrates as a line along one edge of the substrate, as shown in FIG. 5(*b*).

Thus, in an embodiment, the co-linear excitation and detection scheme of FIG. 2 is set with polarisation such that it may excite and collect from a single transition. For optimal efficiency this would be with the laser orientated at 45 degrees to an eigenstate with detection orthogonal to this, at −45 degrees.

Alternatively, in the embodiment described with reference to FIG. 3, there is some component of the eigenstate parallel to the electric field of light in the excitation and detection paths.

Figure 6A:
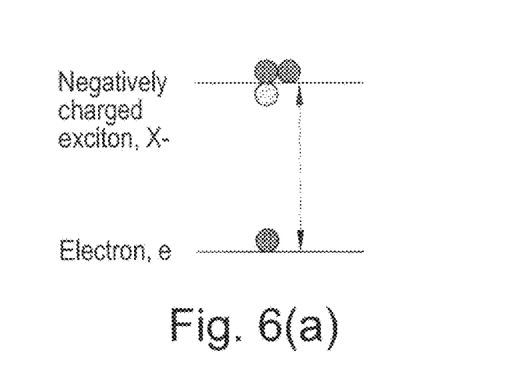
FIG. 6(a) is a schematic of the transition from a negatively charged exciton (two electrons and one hole) to a single electron and FIG. 6(b) shows the degenerate Eigenstates for this transition in a GaAs wafer.
Figure 6B:
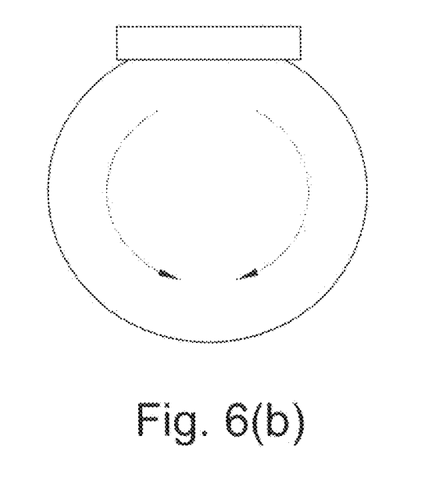

FIG. 6(a) shows the transition from a negatively charged configuration to electron (which could just as favourably be a transition to positively charged configuration to single hole). The eigenstates of this transition couple to circularly polarised photons and are degenerate as shown in FIG. 6(b), thus it should be possible to drive and collect from either degenerate transition and thus, this arrangement can be used in both of the embodiments described with reference to either of FIG. 2 or 3.

There are advantages to using charged transitions of the types described with reference to FIGS. 6(a) and (b) for some applications, for instance where information may be stored in the spin of the charge in the ground state. In this case the dot must be loaded with a single charge prior to being driven by the laser. This would be achieved by injecting a charge from a nearly electrical contact or a dopant atom in the immediate vicinity of the dot.

Figure 7A:
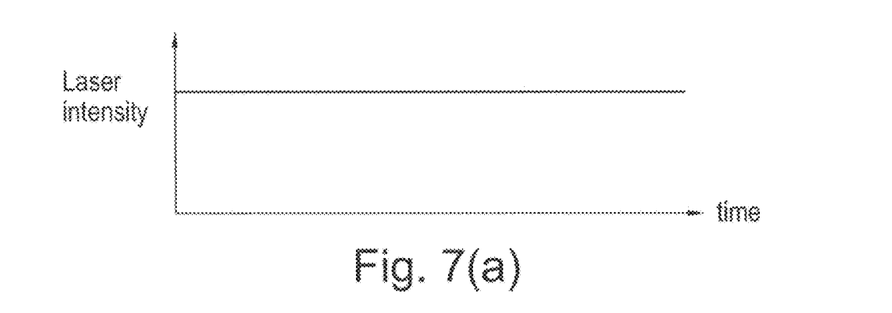
FIG. 7(a) is a plot of the intensity of the input laser beam against time, FIG. 7(b) a plot of the control signal against time, FIG. 7(c) a plot of the energy of the transition against time and FIG. 7(d) a plot of the photon emission probability over the same timescale as FIGS. 7(a) to 7(c)
Figure 7B:
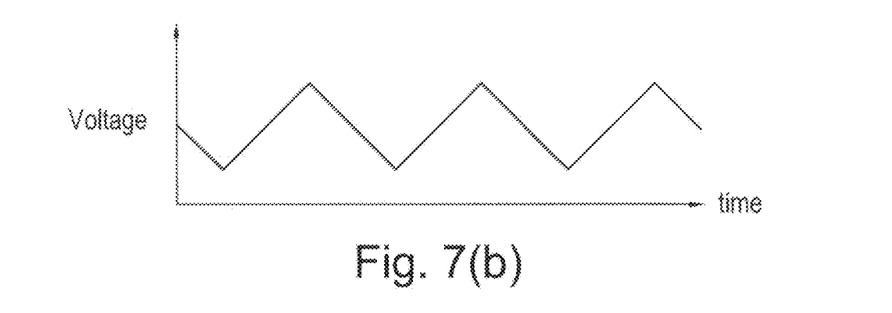

FIG. 7 shows a method of operation of the device described with reference to FIGS. 1 to 6, where the laser is running in a CW mode as shown in the trace of FIG. 7(a) and a varying voltage is applied to the diode as shown in FIG. 7(b).

Figure 7C:
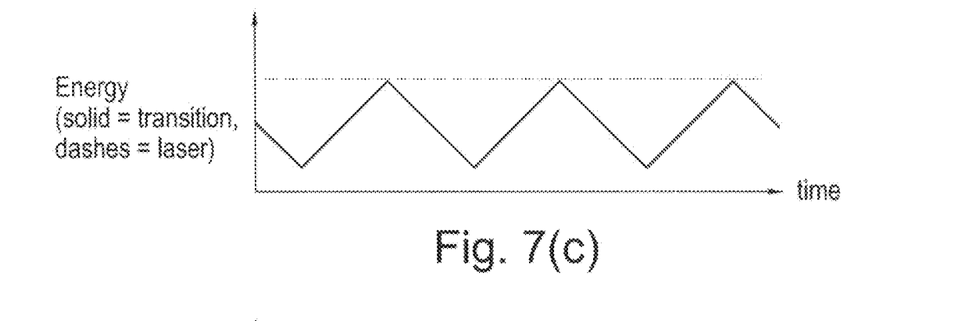
Figure 7D:
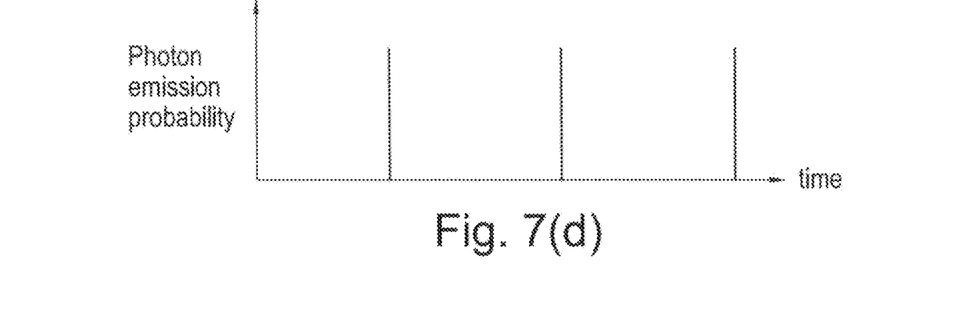

In the example shown here the varying voltage is a saw tooth potential, but could take any form. This voltage will induce a time-varying Stark shift in the energy of the transition, as shown in FIG. 7(c). At some extrema of the Stark shift the transition is in resonance with the laser where it may generate a resonance fluorescence photon. This photon can be emitted only at a narrow range of times set by the voltage applied and the radiative lifetime, but shall have a narrow emission spectrum because of the high coherence laser used as shown in FIG. 7(d).

In a further embodiment, the source may be configured to operate using a so-called π-pulse. Here, it is possible to increase the probability of a photon being scattered by selection of the laser intensity and time varying voltage. When a coherent laser is used to drive a transition between two levels the probably of driving the system to the upper level (and maximising the emission probability) varies sinusoidally with the product of the laser strength and pulse duration. This principle may be applied to source in accordance with embodiments of the present invention.

Figure 8:
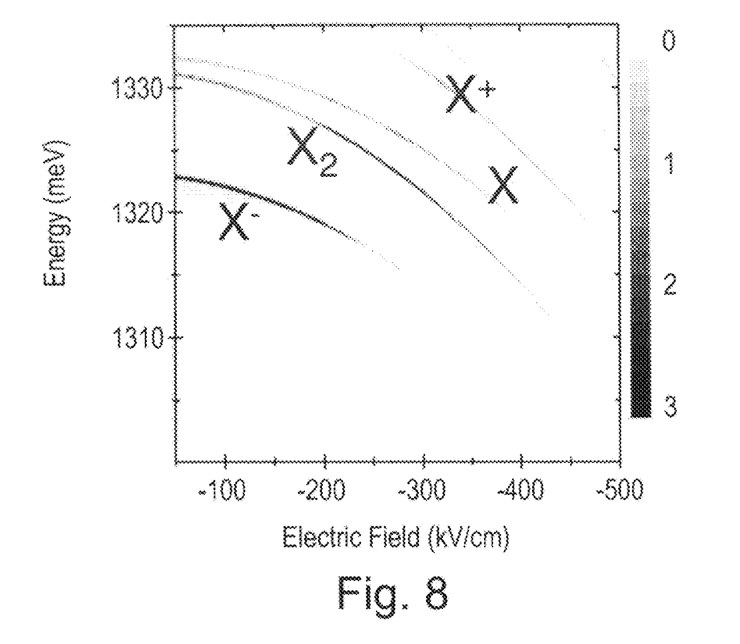
FIG. 8 is experimental data showing the DC Stark shift of the transitions from a single InGaAs/GaAs quantum dot under non-resonant excitation.

FIG. 8 shows experimental data of a device consisting of a single InGaAs/GaAs quantum dot embedded in a GaAs/AlGaAs quantum well. The plot shows the photoluminescence emission from the dots as the DC (static) electric field applied is changed, under non-resonant excitation. The y-axis shows the energy of the relevant transitions against the applied electric field along the x-axis. The plot is a greyscale plot where increasing photon numbers are shown by using a darker grey.

The device used here is of the type described with reference to FIGS. 1(a) and 1(b) where the quantum dot is located within a quantum well. This allows a large electric field to be applied since the quantum dot is provided with further barriers due to the quantum well. In this particular device high fields can lead to Stark shifts of up to 25 meV. This can be used in the device of the type described with reference to FIG. 4 where there are multiple quantum dots which may be adjusted to have a transition at the same energy.

A particularly well-studied type of quantum dots are those formed from InGaAs in a GaAs matrix, but other material systems are suitable for application of this invention. The results shown in FIG. 8 use non-resonant excitation, where carriers are injected to the dot with a high energy using optical excitation. The carriers then lose energy before being trapped in the quantized energy levels of the dot, where they recombine to emit a photon. However, this mode of operation results in accidental population of other energy levels in and around the dot, which can lead to variation in the emission energy through, for example, the coulomb interaction. This is why several transitions are visible at each electric field.

Figure 9:
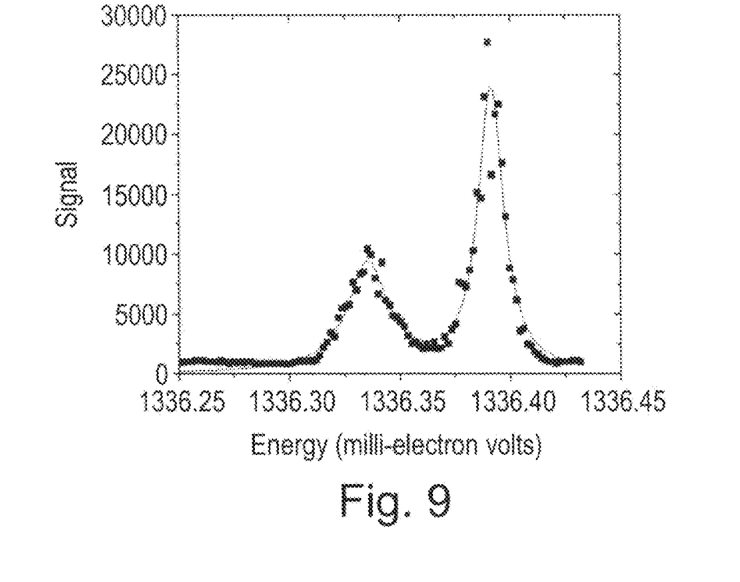
FIG. 9 is experimental data showing the resonance fluorescence signal from a single quantum dot as the DC Stark effect is used to sweep the two eigenstates of the neutral exciton across the laser. The data was recorded using an experimental arrangement similar to FIG. 2.

FIG. 9 shows experimental data from the neutral exciton transitions of a quantum dot in such a diode under a variable, but static DC electric field under resonant excitation in the scheme of FIG. 2. The Y-axis of the plot shows the signal strength in arbitrary units, the x-axis is the energy of the transition in meV.

Here a co-linear excitation and detection path allow the rejection of the laser to a level well below the intensity of the fluorescent light. This is achieved with a rejection of approx. $10^{-5}$ in the polarisation filtering, which can be improved. In this case the laser and detection light are mis-aligned relative to the neutral exciton eigenstates (at plus and minus 45 degrees). Two peaks are clearly visible in the spectrum corresponding to the two fine-structure split eigenstates of the neutral exciton. Autocorrelation measurements have confirmed that when the laser is on resonance with one transition the detected light is anti-bunched.

In the experimental data of FIG. 9, the apparent "linewidth" of the transition achieved by sweeping the voltage is ~15 micro eV. However, when the laser is on resonance with one transition the linewidth of the emitted light is ~1 micro eV, as measured with a high resolution light measurement system. This discrepancy is caused by random variations in the energy of the transition in this particular sample which may be a result of charging of nearby defects, phonon related effects of fluctuations in the bias applied to the diode. Nevertheless, the photons are only emitted at the energy of the laser so retain a very narrow spectrum at each individual voltage and the random variations merely reduce the efficiency of emission.

Figure 10A:
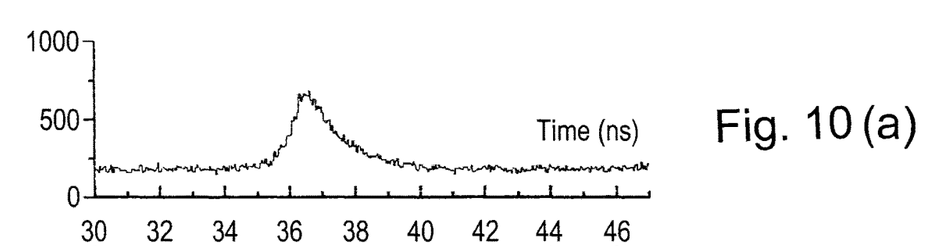
FIG. 10(a) shows the intensity of fluorescent photons emitted is shown against time in ns.

FIG. 10 shows experimental data where the quantum dot shown in FIG. 8 is again excited with a co-linear excitation and detection arrangement with crossed polarisers. In this experiment a time-varying voltage is applied to the diode super-imposed on a DC offset voltage, the latter is slowly varied to move the transition through the laser energy. Note that the laser energy is constant, and it is only at this energy that the transition is excited. However, by changing the DC offset voltage the time at which the photon is generated may be changed. In FIG. 10(a), the intensity of fluorescent photons emitted is shown against time in ns.

Figure 10B:
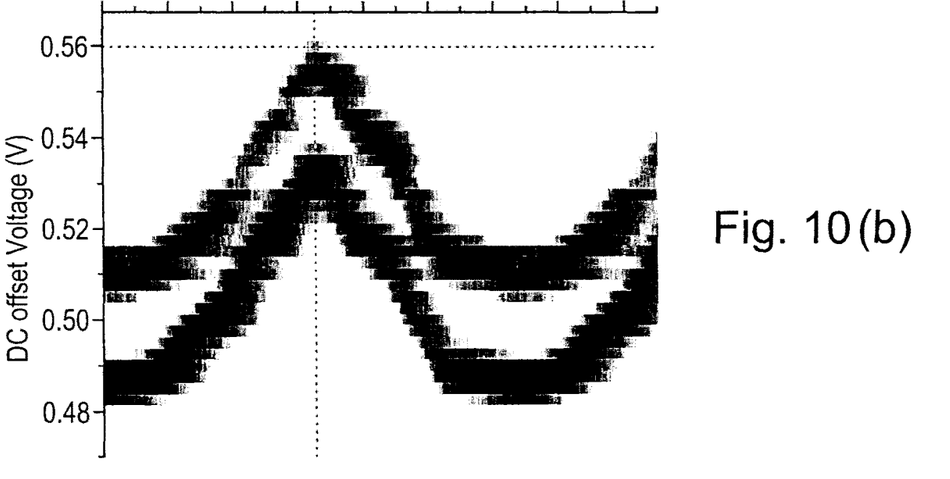
FIG. 10(b) is a plot of the intensity of fluorescent photons emitted (on the greyscale) as a function of the DC offset voltage applied on the y-axis and time in ns shown on the x-axis.

FIG. 10(b) is a plot of the intensity of fluorescent photons emitted (on the greyscale) as a function of the DC offset voltage applied on the y-axis and time in ns shown on the x-axis.

In this example a time varying voltage is applied to the diode with a repetition period of 12 ns. Light is only emitted when one of the neutral exciton transitions are resonant with the laser, indicated by the grey scale. Two transitions are visibly due to the fine-structure splitting of this quantum dot. By varying a DC voltage applied in tandem with the time-varying voltage it is possible to shift the transitions such that only one is resonant with the laser for a short time (at DC offset voltage 0.56V, shown as the horizontal dotted line in FIG. 10b) at which point all photon emission from the dot occurs in a short time range. (see upper plot for a cross section of the data seen at 0.56V). Autocorrelation measurements on this light show it consists of single photons, emitted every 12 ns.

The source in accordance with embodiments of the present invention as described above outputs photons with a very narrow linewidth. Photons with such defined characteristics have uses in quantum communication and quantum computation.

Figure 11A:
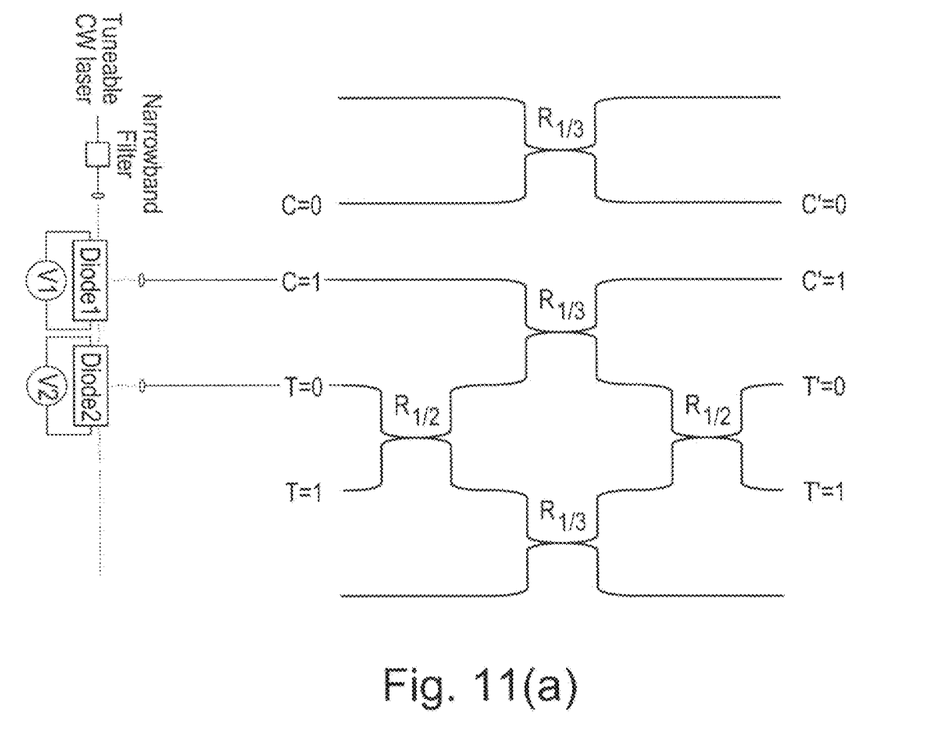
FIG. 11(a) is an example of a logic gate (the controlled-NOT) in which photons may be made to interfere to carry out the desired operation and FIG. 11(b) is a controlled-NOT logic table.
Figure 11B:
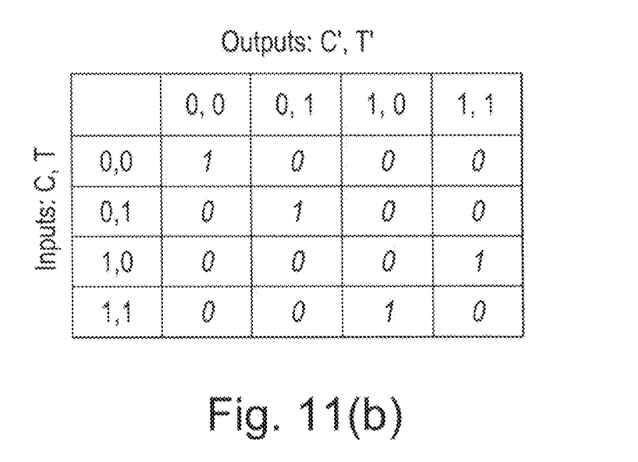

FIG. 11 shows an application for the types of high coherence photon generated by sources in accordance with embodiments of the present invention, based on the CNOT gate. Here single photons are encoded onto the paths through the interferometer which consists of waveguides and a series of reflectivity ½ and ⅓ coupler as shown in FIG. 11(a). The control (C) and target photons (T) are sent into the circuit from the left hand side, through the 4 possible labelled paths, C=0, C=1 and T=0 or T=1. Interference effects in the circuit reproduce the effect of the classical CNOT gate when the photons are deterministically sent into well-defined paths. The output paths on the right hand side can then be measured (by photon detection) to confirm successful operation, or pass the qubits on for further information processing. This gate can work in a "quantum" manner by inputting the control photon in a coherent superposition of modes C=0 and C=1, or the target photon in a superposition of T=0 and T=1 in contrast to classical CNOT gates. FIG. 11(b) shows a logic table for a CNOT gate.

This logic gate is of particular importance in Quantum Information Processing as it is universal and can thus, on combination with trivial single quantum bit operations, achieve any information processing task. It can also be used to entangle or dis-entangle two qubits encoded on the photons. The particular embodiment described here requires two photons as control and target, which must be as indistinguishable as possible to achieve the highest probability of success for the gate operation. Sources in accordance with embodiments of the present invention are particularly well suited to applications such as this where there is a need for multiple indistinguishable photons.

Sources in accordance with the above embodiments can provide a resonantly driven pulsed quantum light source. The sources can be optimised to work at different wavelengths depending on the control signal and are thus largely wavelength independent. Further, the sources can be configured to output a single photon per cycle of the control signal. The design of the source is scalable and can thus be applied to optical quantum computing.

While certain embodiments have been described, these embodiments have been presented by way of example only, and are not intended to limit the scope of the inventions. Indeed the novel sources described herein may be embodied in a variety of other forms; furthermore, various omissions, substitutions and changes in the form of sources described herein may be made without departing from the spirit of the inventions. The accompanying claims and their equivalents are intended to cover such forms of modifications as would fall within the scope and spirit of the inventions.

The invention claimed is:

1. A photon source comprising:
   a quantum structure that defines one or more quantum levels such that a photon may be emitted from the quantum structure due to a transition between at least two quantum levels,
   a laser that provides a laser input beam to irradiate the quantum structure, wherein the laser input beam energy is kept constant and the linewidth of the laser input beam is less than the linewidth of said transition; and
   an electrical, magnetic field, pressure, heat, or strain field control signal source comprising circuitry that generates a time varying control signal, the time varying control signal being an electrical, magnetic field, pressure, heat, or strain field control signal applied to the quantum structure to bring the transition energy into resonance with the laser input beam energy and then back out of resonance with the laser input beam energy, allowing no more than one photon to be outputted from the transition per cycle of the control signal the transition energy being the energy separation between the at least two quantum levels, a transition between which may result in a photon being emitted from the quantum structure.

2. A photon source according to claim 1, wherein the control signal is configured such that the extrema of the control signal brings the transition energy into resonance with the energy of the laser input beam.

3. A photon source according to claim 1, further comprising collection optics for collecting the photon emitted from the structure, wherein the source is configured such that the laser input beam is prevented from entering the collection optics.

4. A photon source according to claim 3, wherein the source comprises polarising components configured to polarise the laser input beam and block the polarised laser input beam from entering the collection optics.

5. A photon source according to claim 1, wherein the quantum structure is provided within a device and the source is configured such that the laser input beam enters the device via a first surface of the device and the photon is emitted via a second surface that is not parallel to the first surface.

6. A photon source according to claim 1, wherein the quantum structure is provided within a device and the laser input beam enters the device through the same surface from which the photon is emitted.

7. A photon source according to claim 1, wherein the transition has degenerate eigenstates and the laser input beam is configured to excite more than one eigenstate.

8. A photon source according to claim 1, the laser is a CW laser.

9. A photon source according to claim 1, wherein the quantum structure comprises a quantum dot.

10. A photon source according to claim 9, wherein quantum structure is provided within a device and the device comprises a p-i-n diode.

11. A photon source according to claim 10, wherein the quantum dot is located in an optical cavity.

12. A photon source according to claim 1, wherein the control signal is an electrical control signal and is configured to control the transition via the quantum confined stark effect.

13. A photon source according to claim 1, comprising a plurality of quantum structures and a control signal applied to each quantum structure, such that the transition in each quantum structure can be brought into resonance with the laser input beam, the laser input beam being supplied to each quantum structure.

14. A photon source according to claim 13, wherein each quantum structure is provided in a separate device.

15. A photon source according to claim 13, wherein the plurality of quantum structures are arranged in series with respect to the laser input beam.

16. A photon source, according to claim 13, configured to output identical photons into a quantum logic component.

17. A photon source according to claim 1, wherein the quantum structure comprises an optically active defect centre in a solid state device.

18. A photon source according to claim 1, wherein the laser input beam and the control signal are configured such that the energy of the laser input beam is degenerate with transition for a time set to maximise the probability of exciting the transition.

19. A photon source according to claim 1, wherein the control signal is configured to shift the transition by an energy greater than half the sum of laser input beam linewidth and linewidth of the transition.

20. A photon source according to claim 1, wherein the intensity of the laser input beam is low enough such that photons are coherently scattered from the transition.

21. A photon generation method, comprising:
irradiating a quantum structure with a laser input beam provided by a laser, wherein the laser input beam energy is kept constant, and the quantum structure defines one or more quantum levels such that a photon may be emitted from the quantum structure due to a transition between at least two quantum levels and the linewidth of the laser input beam is less than the linewidth of said transition; and generating, using circuitry, a time varying electrical, magnetic field, pressure, heat, or strain control signal, the time varying control signal being applied to the quantum structure to bring the transition energy into resonance with the laser input beam energy and then back out of resonance with the laser input beam energy, allowing no more than one photon to be outputted from the transition per cycle of the control signal, the transition energy being the energy separation between the at least two quantum levels, a transition between which may result in a photon being emitted from the quantum structure.

22. A photon source according to claim 1, wherein the laser is a tuneable continuous wave (CW) laser.

* * * * *